United States Patent
Lu

(10) Patent No.: US 6,657,380 B2
(45) Date of Patent: Dec. 2, 2003

(54) ORGANIC ELECTROLUMINESCENT DISPLAY PANEL HAVING A POLYIMIDE-ISOLATING WALL OF REVERSE-TRAPEZOID CROSS-SECTION WITH ELECTRIC, THERMAL AND MECHANICAL STABILITY

(75) Inventor: Tien-Rong Lu, Tainan (TW)

(73) Assignee: Ritek Corporation (TW)

( * ) Notice: Subject to any disclaimer, the term of this patent is extended or adjusted under 35 U.S.C. 154(b) by 39 days.

(21) Appl. No.: 10/156,859

(22) Filed: May 30, 2002

(65) Prior Publication Data

US 2002/0145382 A1 Oct. 10, 2002

Related U.S. Application Data

(62) Division of application No. 09/593,670, filed on Jun. 14, 2000.

(51) Int. Cl.$^7$ .................................................. H01J 1/62
(52) U.S. Cl. ......................................................... 313/504
(58) Field of Search ......................................... 313/504

(56) References Cited

U.S. PATENT DOCUMENTS

| | | | |
|---|---|---|---|
| 5,701,055 A | * 12/1997 | Nagayama et al. | 313/504 |
| 5,962,970 A | 10/1999 | Yokoi et al. | 313/506 |
| 6,025,461 A | 2/2000 | Chiang et al. | 528/353 |
| 6,069,443 A | 5/2000 | Jones et al. | 313/504 |
| 6,107,736 A | * 8/2000 | Shi et al. | 313/509 |
| 6,306,559 B1 | 10/2001 | Tanamura et al. | 430/315 |
| 6,373,187 B1 | 4/2002 | Nagayama et al. | 313/506 |

OTHER PUBLICATIONS

Summary Report: NA/4, Sep. 9, 2002, pp. 23–34.
National Industrial Chemicals Notification and Assessment Scheme, Feb. 18, 1991, pp. 1–9.
Chinese Publication.

* cited by examiner

*Primary Examiner*—Edward J. Glick
*Assistant Examiner*—Jurie Yun
(74) *Attorney, Agent, or Firm*—Lowe Hauptman Gilman & Berner, LLP

(57) ABSTRACT

An organic electroluminescent (OEL) display panel has improved lifetime and better display quality with a reduced amount of residual solvent on the isolating walls of the OEL panel. The organic electroluminescent display panel includes: a substrate, a plurality of first electrodes positioned on the substrate, a plurality of polyimide-isolating walls that are parallel to each other, an organic electroluminescent layer positioned on portions of the first electrodes that are not covered by the polyimide-isolating walls, and a plurality of second electrodes positioned on the organic electroluminescent layer. The cross-section of the polyimide-isolating walls has a reverse-trapezoid shape. The polyimide-isolating walls have electric, thermal and mechanical stability, thereby improving luminescent stability and lifetime of the organic electroluminescent display panel which, in turn, improves the stability and lifetime of the organic electroluminescent display panel.

12 Claims, 2 Drawing Sheets

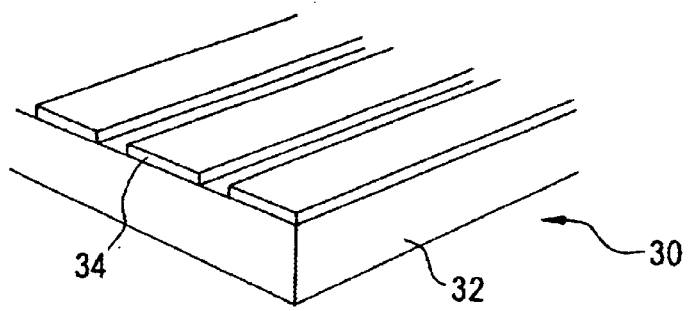
Fig. 2
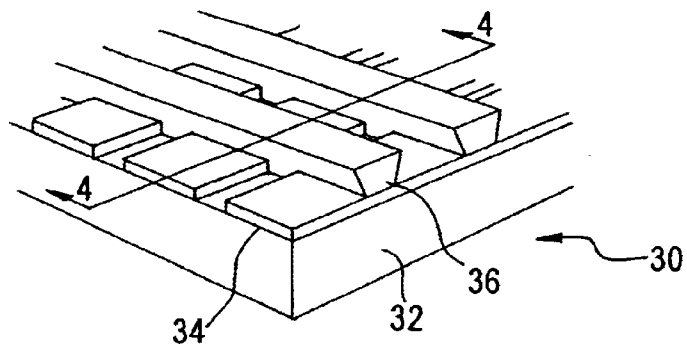
Fig. 3
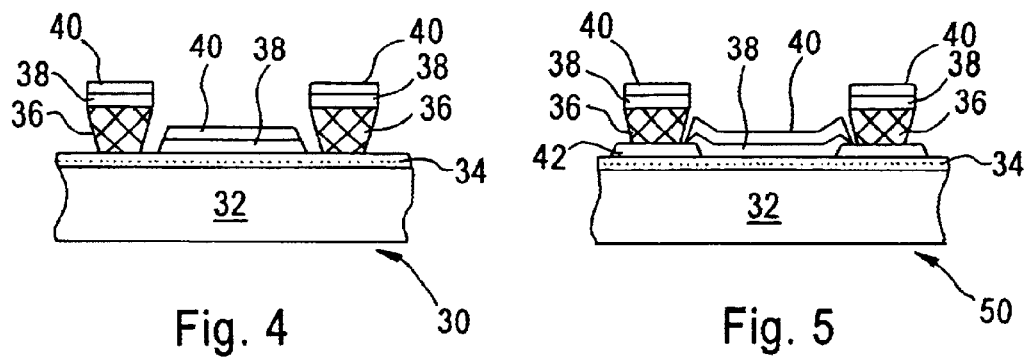
Fig. 4
Fig. 5

ORGANIC ELECTROLUMINESCENT DISPLAY PANEL HAVING A POLYIMIDE-ISOLATING WALL OF REVERSE-TRAPEZOID CROSS-SECTION WITH ELECTRIC, THERMAL AND MECHANICAL STABILITY

This application is a Divisional of application Ser. No. 09/593,670 filed Jun. 14, 2000.

BACKGROUND OF THE INVENTION

1. Field of the Invention

The present invention relates to an organic electroluminescent display panel having polyimide-isolating wall, more particularly, to an organic electroluminescent display panel having a polyimide-isolating wall with a reverse-trapezoid cross-section that possesses electric, thermal and mechanical stability.

2. Description of Related Art

Currently, an organic electroluminescent display (OEL) panel with light weight, high contrast, wide view angle, fast response speed, low power consumption and high brightness becomes the focus of the innovative display panels. However, there are many difficulties to be overcome in the commercialization and mass production of OEL panel.

Generally, the OEL panel comprises a plurality of ITO anodes, a plurality of photoresist-isolating walls perpendicularly positioned on the anodes, an OEL layer positioned between two adjacent photoresist isolating walls on the anodes, and a plurality of cathodes positioned on the OEL layer. The anodes and the cathodes sandwich the OEL layer to form a luminescent pixel of the OEL panel. However, the ordinary photoresist materials often release out the residual solvents or moisture to the sealed space of OEL panel. The released residual solvents or moisture further damage the OEL layer and thereby reduce the quality and lifetime of the panel.

In the technology disclosed in U.S. Pat. Nos. 5,701,055 and 5,952,037, a photoresist (OFPR-8000' offered by Tokyo Ohka Co. ltd) with unsatisfied electric, thermal and mechanical stability is taught to act as isolating walls to isolate anodes and cathode materials. The electric, thermal and mechanical stability of the photoresists disclosed in U.S. Pat. Nos. 5,701,055 and 5,952,037 is not good enough and often causes bad luminescent stability and failure of the panel. On the other hand, the luminance of the OEL panel is driven by a high electric current. The high electric currents and frequent switch operations of the OEL panel further deteriorates the photoresist isolating walls by inducing continuously liberation of harmful substances such as residual moisture and solvents. The degradation of the isolating walls will bring about a short circuit or failure in luminescence and reduce the lifetime of the OEL panel. In addition, the photoresist isolating walls having approximately rectangular cross-section were obtained after performing the exposure process by a mask and the developing process on the ordinary photoresist material. The cathode materials diffuse laterally and thereby possibly contact the anodes during the follow-up deposition of the cathode materials. This will also leads to a short circuit on the panel. Though a multi-layer structure with reverse-trapezoid section is disclosed in published patents before, the procedure of multi-layer isolating walls is complicated and costs high. The process of multi-layer isolating walls is not feasible in the mass production of the OEL panel.

SUMMARY OF THE INVENTION

The object of the present invention is to provide an organic electroluminescent display panel having a polyimide-isolating wall with a reverse-trapezoid cross-section that possesses electric, thermal and mechanical stability and thereby improves the quality and lifetime of an OEL display panel.

In a preferred embodiment, the present invention provides an organic electroluminescent display panel having a polyimide-isolating wall with a reverse-trapezoid section on an OEL display panel. The panel comprises a substrate and a plurality of first electrodes. In the present invention, a coating process is firstly performed to coat a photosensitive-polyimide (PSPI) isolating layer on the panel. Then, a prebaking process, an exposure process, a post-exposure baking (PEB) process and a developing process are performed on the isolating layer in sequence to form the polyimide-isolating wall with the reverse-trapezoid cross-section. Finally, a high temperature curing process is performed on the polyimide-isolating wall with the reverse-trapezoid cross-section to ensure electric, thermal and mechanical stability that thereby improves the stability and lifetime of the OEL display panel.

The OEL display panel can be applied to any purpose or apparatus for displaying images, pictures, symbols and characters. The preferred purpose is used as a display of television, computer, printer, screen, vehicle, signal, communication apparatus, telephone, interactive electronic book, microdisplay, fishing apparatus, personal digital assistant, game, airplane and game goggle.

It is an advantage of the present invention that the organic electroluminescent display panel having the polyimide-isolating wall with the reverse-trapezoid cross-section can isolate cathode materials and anodes and meet the mass production requirements. The polyimide-isolating wall with the reverse-trapezoid cross-section provides with good comparability and interface adhesion with the under pixel-defining layer of polyimide. Preferably, the polyimide-isolating wall with the reverse-trapezoid cross-section is made of photosensitive polyimide or a precursor thereof. Also, the polyimide-isolating wall with electric, thermal and mechanical stability can ensure the luminescent stability of the OEL panel.

Other objects, advantages, and novel features of the invention will become more apparent from the following detailed description when taken in conjunction with the accompanying drawings.

BRIEF DESCRIPTION OF THE DRAWINGS

FIG. 2 to FIG. 4 are schematic diagrams of the method of forming a polyimide-isolating wall with a reverse-trapezoid cross-section according to the present invention; and FIG. 5 is a schematic cross-section diagram of another organic electroluminescent display panel according to the present invention.

DETAILED DESCRIPTION OF THE PREFERRED EMBODIMENT

Figure 1:
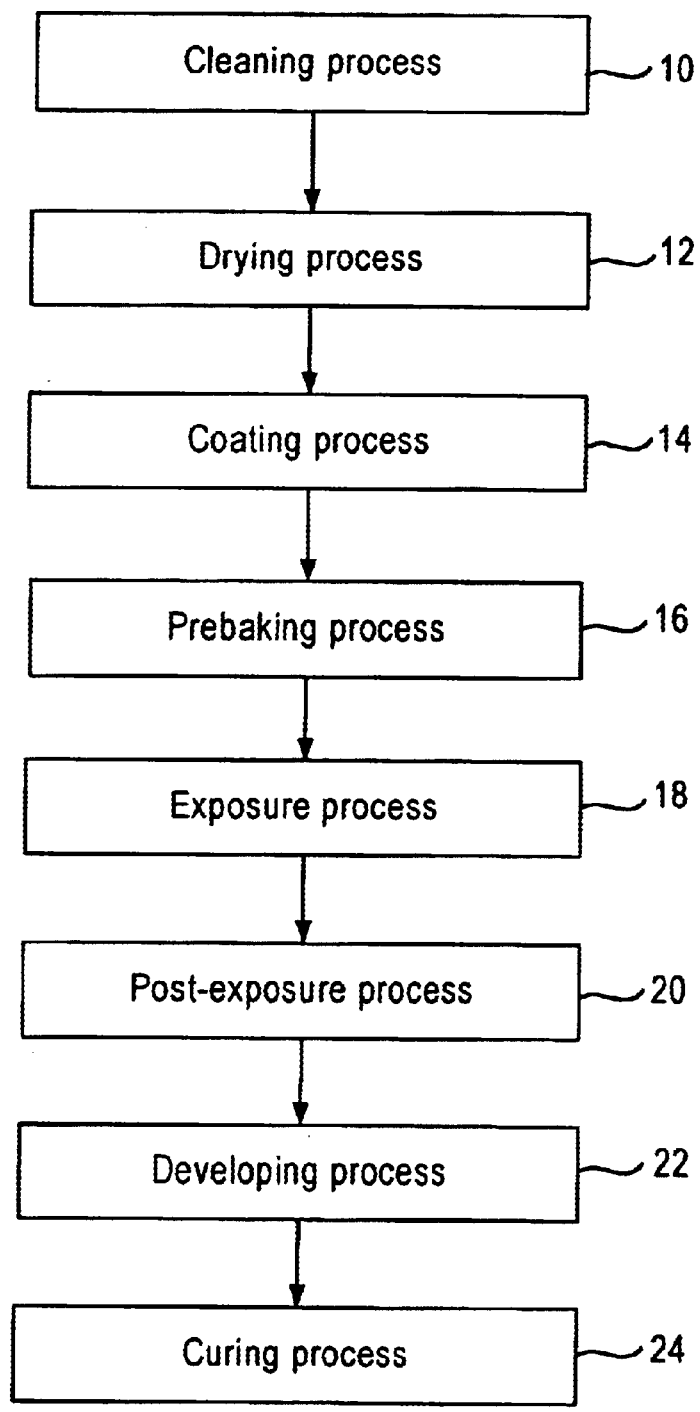
FIG. 1 is a flow chart of a method according to the present invention.

Please refer to FIG. 1. FIG. 1 is a flow chart of a method according to the present invention. The present invention provides a method for forming a polyimide-isolating wall with a reverse-trapezoid cross-section on anodes of an OEL panel to be a self-supporting shadow mask in subsequent evaporation. The present invention also provides an organic electroluminescent display panel with a polyimide-isolating wall having a cross-section in a shape of reverse-trapezoid, and the polyimide-isolating wall possesses electric, thermal and mechanical stability and thereby improves luminescent stability and lifetime of the organic electroluminescent display panel.

Firstly, a cleaning process 10 and a baking process 12 are performed on the panel in sequence to rinse and dry the panel. Then, an ion generator is employed to remove the static electricity on the panel against the discharge damage of panel. Next, a coating process 14 is performed to coat a photosensitive-polyimide (PSPI) isolating layer on the panel. Next, a prebaking process 16 is performed on the panel to liberate the solvents in the isolating layer. Afterwards, an exposure process 18 is performed by a mask on the isolating layer to form a light-diffusing gradient between the top and bottom of the isolating layer. Then, a post-exposure baking (PEB) process 20 is performed to restructure the isolating layer. Next, a developing process 22 is performed to dissolve part of the isolating layer that does receive light and thereby form a pattern of the polyimide-isolating wall. Since the top of the isolating layer absorbs sufficient energy in the exposure process 18, the crosslinking of the top is stronger. On the contrary, the crosslinking of the bottom is weaker since the bottom of the isolating layer absorbs insufficient energy due to the obstacle of thickness. It is therefore that dissolved part of the bottom is more than dissolved part of the top in the developing process 22 so as to shape the polyimide-isolating wall as the reverse-trapezoid cross-section. Finally, a high temperature curing process 24 is performed to heat the polyimide-isolating wall at a temperature between 220° C. and 450° C. This hardens the polyimide-isolating wall with complete crosslinking and which thereby possesses electric, thermal and mechanical stability. It is good for promoting luminescent stability and lifetime of the OEL display panel.

Compared with the prior art, in the method of the present invention, the PSPI isolating layer is a negative photoresist layer that can be dissolved and patterned only by the developing process 22 without other photoresist steps such as coating, developing and stripping. Also, the developing process 22 utilizes that the crosslinking and dissolving rate of each part of the PSPI isolating wall are changed according to thickness to form the reverse-trapezoid cross-section. It can reduce the material-consumption cost and meet in mass production requirements. Furthermore, using the polyimide-isolating wall of reverse-trapezoid cross-section as a self-supporting shadow mask can rudimentarily prevent the anodes being contacted with cathode materials that laterally diffuse in the follow-up evaporation. By the way, a pixel-defining layer can be formed between the polyimide-isolating wall and the anodes to define the luminescent pattern of the anodes and completely isolate the anodes and the cathode materials that lateral diffuse. The polyimide-isolating wall with the reverse-trapezoid cross-section also provides with good comparability and interface adhesion with the under pixel-defining layer of polyimide. This will further avoid a short circuit and ensure the luminescent performance of the OEL display panel.

In another embodiment of the present invention, a polyimide precursor can substitute for the photosensitive polyimide-isolating layer in the coating process 14 and then proceed the prebaking process 16, the exposure process 18, the post-exposure baking process 20 and the developing process 22 in sequence. The polyimide precursor forms a polyamic acid in the pose-exposure baking process 20, and that further crosslinks in the high temperature curing process 24 to be the polyimide-isolating wall of reverse-trapezoid cross-section with electric, thermal and mechanical stability.

Please refer to FIG. 2 to FIG. 4. FIG. 2 to FIG. 4 are schematic diagrams of the method of forming a polyimide-isolating wall with a reverse-trapezoid cross-section according to the present invention. The method of the present invention is applied to form a polyimide-isolating wall 36 with a reverse-trapezoid cross-section on an OEL display panel 30. As shown in FIG. 2, the panel 30 comprises a transparent substrate 32, and a plurality of anodes 34 in parallel positioned on the substrate 32 corresponding to luminescent areas. According to the flow chart shown in FIG. 1, the panel 30 proceeds by the steps: cleaning process 10, baking process 12, coating process 14 (coating a photosensitive polyimide-isolating layer or a polyimide precursor), prebaking process 16, exposure process 18, post-exposure baking process 20, developing process 22 and curing process 24. Since the crosslinking is stronger at the top and the dissolution rate is quicker at the bottom, the developing process 22 forms the polyimide-isolating wall 36 with a reverse-trapezoid cross-section. The high temperature curing process 24 is performed to heat the polyimide-isolating wall 36 at a temperature between 220° C. and 450° C. This hardens the polyimide-isolating wall 36 with complete crosslinking and which thereby possesses electric, thermal and mechanical stability. It is good for luminescent stability and lifetime of the panel 30. As shown in FIG. 3, the polyimide-isolating wall 36 is formed as a plurality of parallel strips that is perpendicularly positioned on the plurality of anodes 34.

As shown in FIG. 4 (the cross-section diagram along line 3—3 of the panel 30 shown in FIG. 3), an OEL layer 38 and a plurality of cathodes 40 are then evaporated on the anodes 34 between two adjacent strips of the polyimide-isolating wall 36 in sequence, wherein the cathodes 40 are perpendicular to the anodes 34. The anode 34 and the cathode 40 sandwich the OEL layer 38 to form a luminescent pixel of the OEL display panel. The polyimide-isolating wall 36 with electric, thermal and mechanical stability can improve luminescent stability of the panel 30. Also, after high temperature curing there is no residual solvent or moisture liberated from the polyimide-isolating wall 36 to damage the OEL layer 38, and thereby the lifetime of the panel 30 is increased.

Please refer to FIG. 5. FIG. 5 is a schematic cross-section diagram of another OEL display panel 50 according to the present invention. In the cause of further preventing the anodes 34 being contacted by the cathode materials, a pixel-defining layer 42 is formed between the anode 34 and the polyimide-isolating wall 36. The pixel-defining layer 42 not only defines a luminescent pattern of the anodes 34, but also completely isolates the anodes 34 and the cathode materials that laterally diffuse. The polyimide-isolating wall with the reverse-trapezoid cross-section also provides with good comparability and interface adhesion with the under pixel-defining layer of polyimide. This avoids a short circuit and thereby ensures the luminescent quality of the panel 50.

Although the present invention has been explained in relation to its preferred embodiment, it is to be understood that many other possible modifications and variations can be made without departing from the spirit and scope of the invention as hereinafter claimed.

What is claimed is:

1. An organic electroluminescent display panel, comprising
   a substrate;
   a plurality of first electrodes positioned in parallel on the substrate;
   a plurality of polyimide-isolating walls that are parallel to each other and positioned on and perpendicular to the first electrodes to define a self-supporting shadow mask;

an organic electroluminescent layer positioned on portions of the first electrodes that are not covered by the self-supporting shadow mask; and a plurality of second electrodes positioned on the organic electroluminescent layer;

wherein a cross-section of the polyimide-isolating walls is in a shape of a reverse-trapezoid, the polyimide-isolating walls are made of one selected from the group consisting of a photosensitive polyimide or a precursor thereof.

2. The organic electroluminescent display panel as claimed in claim 1, further comprising a pixel-defining layer positioned on the first electrodes for defining a luminescent pattern of the first electrodes.

3. The organic electroluminescent display panel as claimed in claim 1, wherein the first electrodes are perpendicular to the second electrodes.

4. The organic electroluminescent display panel as claimed in claim 1, wherein the panel is applied to a microdisplay.

5. The organic electroluminescent display panel as claimed in claim 1, wherein the substrate is made of silicon.

6. An organic electroluminescent display panel, comprising a substrate;

at least a first electrode formed on the substrate;

at least a polyimide-isolating wall formed on top of and crossing the first electrode to define a self-supporting shadow mask;

an organic electroluminescent layer formed on a portion of the first electrode that is not covered by the self-supporting shadow mask; and at least a second electrode formed on the organic electroluminescent layer;

wherein a cross-section of the polyimide-isolating wall tapers towards the first electrode, and the polyimide-isolating wall is made of a material selected from the group consisting of a photosensitive polyimide or a precursor thereof.

7. The organic electroluminescent display panel as claimed in claim 6, further comprising a pixel-defining layer formed on the first electrode in region corresponding to the polyimide-isolating wall to define a luminescent pattern of the first electrode.

8. The organic electroluminescent display panel as claimed in claim 7, wherein the first electrode is perpendicular to the second electrode.

9. The organic electroluminescent display panel as claimed in claim 7, wherein the panel is part of a microdisplay.

10. The organic electroluminescent display panel as claimed in claim 7, wherein the substrate is made of silicon.

11. The organic electroluminescent display panel as claimed in claim 1, wherein the polyimide-isolating wall is formed on top of the pixel-defining layer.

12. The organic electroluminescent display panel as claimed in claim 6, wherein an organic electroluminescent material of the organic electroluminescent layer and a conductive material of the second electrode are also present on top of the polyimide-isolating wall.

* * * * *